United States Patent [19]

Lewis

[11] Patent Number: 4,938,351

[45] Date of Patent: Jul. 3, 1990

[54] MODULAR ELECTRICAL COMPONENT PACKAGING SYSTEM

[75] Inventor: William D. Lewis, San Jose, Calif.

[73] Assignee: International Business Machines Corporation, Armonk, N.Y.

[21] Appl. No.: 368,832

[22] Filed: Jun. 20, 1989

[51] Int. Cl.$^5$ .............................................. B65D 7/00
[52] U.S. Cl. ..................................... 206/328; 220/4 F
[58] Field of Search ............... 206/328; 220/4 R, 4 F, 220/75, 76

[56] References Cited

U.S. PATENT DOCUMENTS

| | | | |
|---|---|---|---|
| 3,672,531 | 6/1972 | Balven | 220/4 F |
| 3,687,325 | 8/1972 | Simons | 220/4 F |
| 3,966,285 | 6/1976 | Porch et al. | 220/4 F |
| 3,987,924 | 10/1976 | Ultz | 220/4 F |
| 4,247,882 | 1/1981 | Prager et al. | |
| 4,313,149 | 1/1982 | Hirose et al. | |
| 4,652,969 | 3/1987 | Stegenga | |
| 4,699,270 | 10/1987 | Bohm | |

OTHER PUBLICATIONS

K. N. Gower, "Adjustement Covers for System Frames", vol. 20, No. 12, 05/78, pp. 5236–5238.
W. S. Sheppley, Jr., "Modular Electrical Enclosure", vol. 13, No. 9, 02/71, pp. 2642–2643.
W. Fischer et al., "Machine Cover System", vol. 17, No. 11, 04/75, pp. 3310–3311.

J. R. Isaacs et al., "Universal Rack Construction", vol. 21, No. 3, 08/78, pp. 1232–1233.

Primary Examiner—Joseph Man-Fu Moy
Attorney, Agent, or Firm—Andrew J. Dillon

[57] ABSTRACT

A modular electrical component packaging system which utilizes a plurality of identical structural elements is disclosed. The system incorporates one or more generally rectangular card cages for receiving and retaining printed circuit boards, power supplies, ventilation fans etc. Welded onto, bolted to, formed integrally on, or attached separately to two opposed sides of each rectangular card cage are a pair of identical vertically oriented channel members which serve to provide vertical support and to enclose a lock mechanism. A plurality of identical exterior panel members is provided, each including a planar surface and a pair of generally perpendicular side walls having mounting pins for coupling each exterior panel member to a pair of vertical channel members. Each exterior panel member thus overlies an entire side of the generally rectangular card cage and a portion of each side of the card cage having a vertical channel member mounted thereon. The lock mechanism within each vertical channel member serves to selectively engage the mounting pins, thereby securing each exterior panel member in place. In this manner, each card cage within a stacked modular system requires two identical vertical channel members and two identical exterior panel members, thereby minimizing the number of distinct structural elements which must be provided for the packaging system.

12 Claims, 3 Drawing Sheets

MODULAR ELECTRICAL COMPONENT PACKAGING SYSTEM

BACKGROUND OF THE INVENTION

1. Technical Field:

The present invention relates generally to the field of mounting and storing electrical components and in particular to the field of modular packaging systems for printed circuit boards, power supplies and the like. Still more particularly, the present invention relates to low cost modular packaging systems for electrical components which utilize multiple identical packaging structural elements.

2. Background Art:

Known systems for packaging electrical components have generally consisted of separate structures which are constructed of multiple unique components. Typically, a vertical cabinet is constructed which includes a frame and vertical mounting rails which are attached along the front of the frame. Next, subframes or subracks holding electrical components and adapted to slide within the main frame are added. Typically, a subframe, such as a "card cage" will occupy a significant amount of space along the interior portions of the main frame. Thereafter, multiple external panels or doors are provided, each of which is uniquely designed for a particular location within the packaging system.

Known prior art frame/subframe packaging systems may include an internal rack which permits the side by side mounting of multiple connection boxes which may be filled with printed circuit cards. Similarly, some known packaging systems permit an adjustable card cage or cabinet to be utilized so that printed circuit boards having differing widths may be simultaneously stored. Such systems often permit the stacking of multiple units wherein unused circuit boards may be stored within the packaging system. Recently a modular packaging system has been proposed which attempts to minimize wasted space within the package's system by providing individual structural elements or modules which provide both the strength of a separate frame system and the internal structure necessary to mount electrical components such as circuit boards without the use of subracks. The resultant structure is said to provide additional useable space within the packaging system for electrical components; however, it must also be constructed of a large number of unique panels and structural elements.

It should therefore be obvious that a need exists for a modular electrical component packaging system which utilizes a small number of structural elements, many of which are identical, so that the construction and maintenance costs for such a system may be minimized.

SUMMARY OF THE INVENTION

It is therefore one object of the present invention to provide an improved modular electrical component packaging system.

It is another object of the present invention to provide an improved modular electrical component packaging system which utilizes multiple identical packaging structural elements.

It is still another object of the present invention to provide an improved modular electrical component packaging system which utilizes multiple identical packaging structural elements and which may be expanded to accommodate a larger number of electrical components without the necessity of creating an entirely new packaging system.

The foregoing objects are achieved as is now described. The modular electrical component packaging system of the present invention utilizes a plurality of identical structural elements. The system incorporates one or more generally rectangular card cages for receiving and retaining printed circuit boards, power supplies, ventilation fans or the like. Welded onto, bolted to, formed integrally onto or attached to separately two opposed sides of each rectangular card cage are a pair of identical vertically oriented channel members which serve to provide vertical support and to enclose a lock mechanism. A plurality of identical exterior panel members is provided, each including a planar surface and a pair of generally perpendicular side walls having mounting pins for coupling each exterior panel member to a pair of vertical channel members, each exterior panel member thus overlies an entire side of the generally rectangular card cage and a portion of each side of the card cage having a vertical channel member mounted thereon. The lock mechanism within each vertical channel member serves to selectively engage the mounting pins, thereby securing each exterior panel member in place. Thus, each card cage within a stacked modular system requires two identical vertical channel members and two identical exterior panel members, thereby minimizing the number of distinct structural elements which must be provided.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
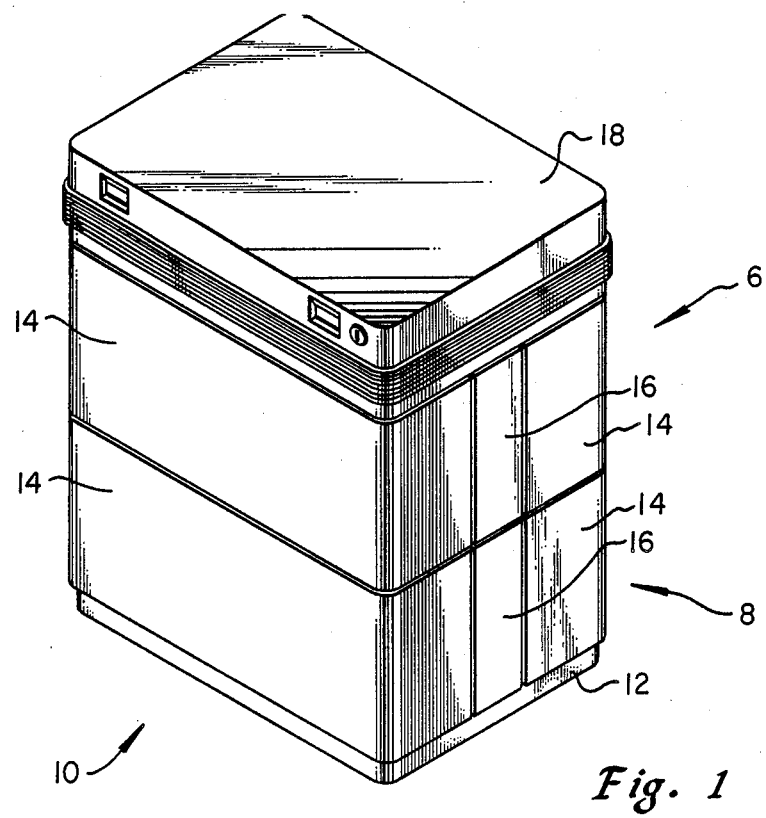
FIG. 1 illustrates a perspective view of a modular electrical component packaging system constructed in accordance with the present invention.

With reference now to the figures and in particular with reference to FIG. 1, there is depicted a perspective view of a modular electrical component packaging system 10 which has been constructed in accordance with the present invention. As may be seen, modular electrical component packaging system 10 of the present invention is assembled utilizing an upper module 6 and a lower module 8 which are assembled upon base unit 12 in a manner which will be described in greater detail herein. As may be seen, upper module 6 is disposed above lower module 8 and lower module 8 is disposed above base unit 12. While the configuration of modular electrical component packaging system 10 depicted in FIG. 1 shows only two modules, those skilled in the art upon reference to the foregoing specification will appreciate that there are an unlimited number of combinations of modules which may be assembled together to meet the needs of a particular user for a particular modular packaging system.

Still referring to FIG. 1, it may be seen that modular electrical component packaging system 10 is constructed utilizing a plurality of substantially identical panels, thus achieving a high degree of efficiency in terms of the design and construction of such a system. For example, the depicted embodiment of modular electrical component packaging system 10 utilizes four substantially identical exterior panels 14 and four substantially identical vertical channels 16. In a manner which will be explained in greater detail herein, top panel 18 is mounted to the upper surface of upper module 6 to complete the construction of modular electrical component packaging system 10.

Figure 2:
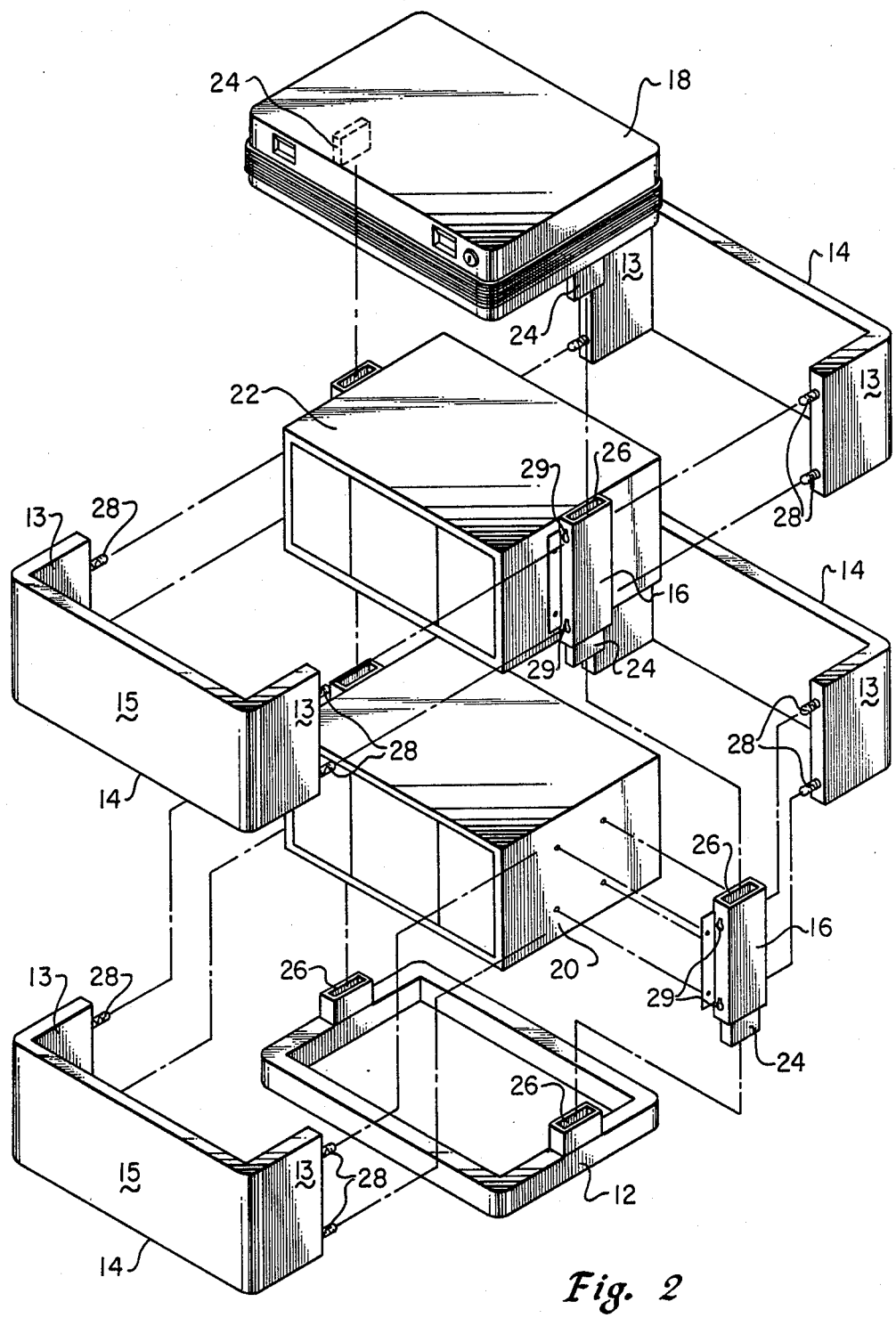
FIG. 2 illustrates an exploded view of the modular electrical component packaging system of FIG. 1.

Referring now to FIG. 2, there is depicted an exploded view of modular electrical component packaging system 10 of FIG. 1 which illustrates the manner in which the system may be assembled. As may be seen, the modular system is assembled utilizing a lower card cage 20 and an upper card cage 22, both of which are generally rectangular printed circuit card cages of a type well known in the prior art. Each card cage has two pairs of vertical opposed sides. As is illustrated, a vertical channel 16 is disposed vertically and generally centrally located on each of a first pair of opposed vertical side panels of each card cage.

Those skilled in the art will appreciate that each vertical channel 16 may be attached to its associated card cage by welding, bolting or otherwise attaching, or forming each vertical channel 16 integrally with each card cage. As is illustrated, each vertical channel 16 includes a female receptacle 26 disposed at the upper end thereof and a male insert 24 at the lower end thereof. In this manner, after each vertical channel 16 has been disposed on a side of either upper card cage 22 or lower card cage 20, the card cages may be stacked by inserting each male insert 24 into a corresponding female receptacle 26 of a vertical channel 16 which is disposed on a lower card cage. In this manner, vertical support is provided in a manner which permits a large number of printed circuit card cages to be stacked together.

Still referring to FIG. 2, it may be seen that base unit 12 also includes a pair of female receptacles 26 which are adapted to receive male insert 24 from a vertical channel 16 which is mounted to the lowest card cage within the modular system. Similarly, top panel 18 includes a male insert 24 which is adapted to be inserted into female receptacle 26 of a vertical channel 16 which is disposed in conjunction with the printed circuit card cage at the uppermost level within modular electrical component packaging system 10.

Next, an important feature of the present invention is illustrated with reference to exterior panels 14. As may be seen, each exterior panel 14 in the depicted embodiment of the present invention is substantially identical to all other exterior panels and each includes a large planar surface 15 capable of overlying an entire side of a printed circuit card cage along with two planar side surfaces 13 which are integral with and generally perpendicular to large planar surface 15. Mounted at the end of each of planar side surfaces 15 are a plurality of mounting pins 28. Thus, the insertion of mounting pins 28 into corresponding apertures 29 within each vertical channel 16 will serve to mount each exterior panel 14 in a manner which completely surrounds both lower card cage 20 and upper card cage 22. In this manner, four identical panels may be utilized thus obviating the necessity of designing and manufacturing multiple exterior panels which are utilized in a specific relation to the remainder of the modular packaging system. As may be seen, each exterior panel 14 thus overlies one entire side of a printed circuit card cage and a portion of each of the two sides which are perpendicular to that side.

Figure 3:
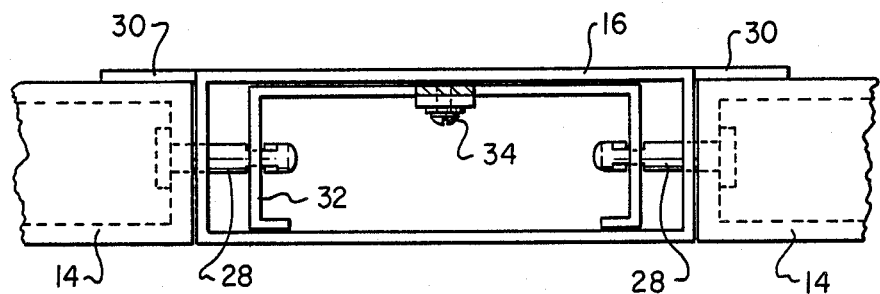
FIG. 3 illustrates a sectional view of a vertical channel member which is utilized in conjunction with the modular electrical component packaging system of the present invention.

With reference now to FIG. 3, there is depicted a downward sectional view of a vertical channel 16 which may be utilized in conjunction with modular electrical component packaging system 10 of the present invention which illustrates the manner in which multiple exterior panels 14 may be coupled to each vertical channel 16. As may be seen, each vertical channel 16 in the embodiment depicted within FIG. 3 includes a pair of mounting flanges 30 which may be utilized to mount vertical channel 16 to an associated printed circuit card cage. As is illustrated, as a mounting pin 28 attached to an exterior panel 14 is inserted into a corresponding aperture 29 of vertical channel 16, each mounting pin 28 is also inserted through a corresponding aperture within lock channel 32. Each vertical channel 16 preferably includes a lock channel 32 which is mounted in a manner which is movable in a vertical direction within vertical channel 16 so as to provide a locking feature in a manner which will be explained in greater detail herein. Each lock channel 32 preferably includes a linking flange 36 (not shown) which may be utilized in conjunction with linking bolt 34 to link together a number of lock channels 32 within multiple vertical channels 16 so that all exterior panels 14 may be locked and unlocked in unison.

Figure 4:
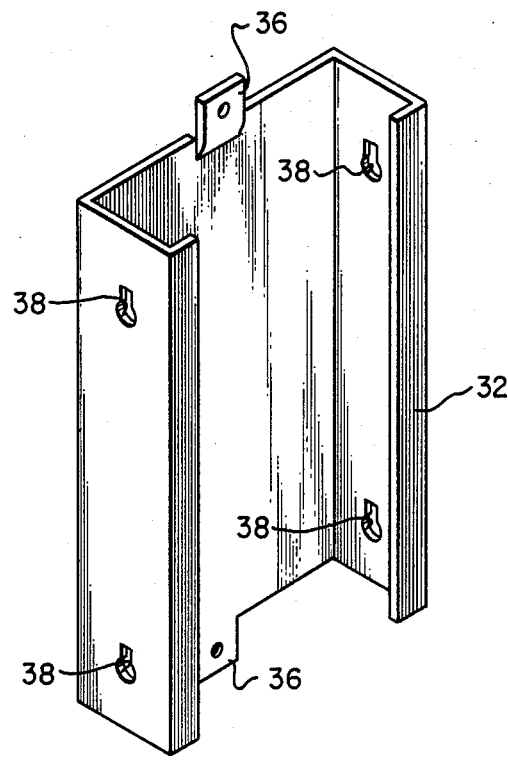
FIG. 4 illustrates a perspective view of a lock channel which is utilized in conjunction with the modular electrical component packaging system of the present invention.

Referring now to FIG. 4, there is depicted a perspective view of lock channel 32 which may be utilized in conjunction with modular electrical component packaging system 10 of the present invention. As may be seen, each lock channel 32 includes a linking flange 36 at each end thereof whereby multiple lock channels may be linked together within multiple vertically disposed vertical channels so that a plurality of exterior panels 14 may be locked and unlocked in unison. As is illustrated, each lock channel 32 includes a plurality of keyhole apertures 38 which are utilized in conjunction with mounting pins 28 in a manner which will be illustrated with reference to FIGS. 5A and 5B.

Figure 5A:
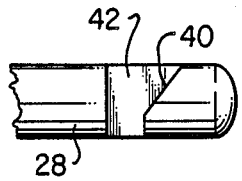
FIGS. 5A and 5B are a side view and top view respectively of a mounting pin which is utilized in conjunction with the modular electrical component packaging system of the present invention.
Figure 5B:
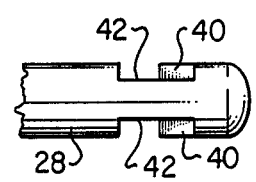

Referring now to FIGS. 5A and 5B there are depicted a side view and a top view respectively of a mounting pin 28 which is utilized in conjunction with keyhole aperture 38 in modular electrical component packaging system 10 of the present invention. As may be seen, each mounting pin 28 includes a slot 42, thereby diminishing the effective width of a mounting pin 28 at that portion wherein slot 42 has been cut. As is illustrated, each slot 42 includes a bevel surface 40 which, as those skilled in the art will appreciate, will act in concert with keyhole aperture 38 to urge each exterior panel 14 into a mated relationship with a vertical channel 16.

The operation of this locking mechanism occurs by the insertion of a mounting pin 28 into the rounded portion of each keyhole aperture 38. Thereafter, as a lock channel 32 is moved vertically, in a downward direction, the slotted portion of each keyhole aperture 38 will engage with bevel surface 40, drawing each mounting pin 28 inward, effectively urging each exterior panel 14 into tighter contact with each vertical channel 16.

Figure 6:
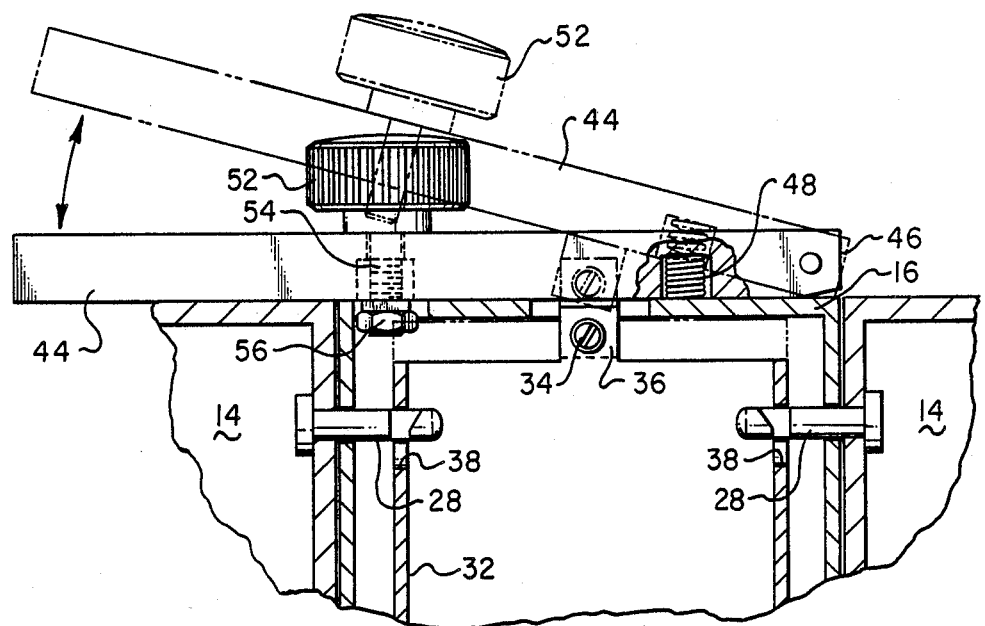
FIG. 6 is a partially sectional view illustrating the operation of a lock mechanism of the novel electrical component packaging system which may be utilized in conjunction with the modular electrical component packaging system of the present invention.

One manner in which the vertical movement of each lock channel 32 may be accomplished in order to lock a plurality of exterior panels 14 into place is illustrated in FIG. 6 which depicts a partially sectional view of the operation of one lock mechanism which may be utilized. As may be seen, the depicted lock mechanism includes a lock bar 44 which is pivotally mounted about lock bar pivot 46 at one edge of an uppermost vertical channel 16. Lock bar 44 is preferably mounted to the uppermost linking flange 36 of the uppermost lock channel 32 utilizing linking bolt 34. Additionally, lock bar spring 48 may be utilized to urge the lock bar 44 into the upper position depicted in phantom within FIG. 6.

Thereafter, the manual urging of lock bar 44 into a downward position will effectively move each lock channel 32 within the aligned vertical channels 16 in a downward manner, thus urging each mounting pin 28 and its associated exterior panel 14 inward into closer contact with vertical channel 16, as explained above with regard to FIG. 4 and FIGS. 5A and 5B.

In one preferred embodiment of the present invention, a lock down bolt 52 having a lock down bolt shaft 54 is utilized to retain lock bar 44 in the horizontal position depicted within FIG. 6, by threading the threaded portion of lock down bolt shaft 54 into a floating nut 56 which is provided in the upper surface of vertical channel 16. Thus, after manually urging lock bar 44 into a downward position and threading lock down bolt shaft 54 into floating nut 56, the linked lock channels 32 will all be maintained in a downward or locked position, thus preventing the removal of exterior panels 14 until lock down bolt 52 has been unthreaded, allowing lock bar 44 to be urged into the upward position by the action of lock bar spring 48.

Those skilled in the art upon reference to the foregoing specification will appreciate that the Applicant has provided a novel modular electrical component packaging system which utilizes a plurality of substantially identical panels which may be assembled together in an infinite variety of ways, each providing a system for packaging multiple electrical components without the necessity of designing a large number of distinct and unique panels for each application. Those skilled in the art will appreciate that exterior panels 14 and top panel 18 may be simply and easily constructed of foamed or formed plastic utilizing a molding procedure, thus further increasing the cost effectiveness of the disclosed design. In the manner described, it is possible to create a modular component system which is easily expandable and which will accommodate a large variation in the number and type of electrical components which may be contained therein. Further, the disclosed system easily accommodates the utilization of standard printed circuit card cage components or the utilization of specially designed card cages having a pair of vertical channels integrally formed thereon or attached separately.

While the invention has been particularly shown and described with reference to a preferred embodiment, it will be understood by those skilled in the art that various changes in form and detail may be made therein without departing from the spirit and scope of the invention.

I claim:

1. A modular packaging system for electrical components comprising:
   at least one generally rectangular card cage having two pairs of opposed vertical side panels for receiving and retaining electrical components therein.
   two substantially identical channel members each disposed vertically and generally centrally located on one of a first pair of opposed vertical side panels;
   two substantially identical exterior panel members, each having a first planar surface for overlying an entire one of a second pair of opposed vertical side panels and having a pair of planar side surfaces integral with and generally perpendicular to said first planar surface each overlying at least a portion of one of said first pair of opposed vertical side panels; and
   means for coupling each of said two substantially identical exterior panel members to both of said two substantially identical channel members.

2. The modular packaging system for electrical components according to claim 1 further including a top panel for overlying the top of said at least one generally rectangular card cage.

3. The modular packaging system for electrical components according to claim 2 further including means coupling said top panel to both of said two substantially identical channel members.

4. The modular packaging system for electrical components according to claim 1 wherein said means for coupling each of said two substantially identical exterior panel members to both of said two substantially identical channel members comprises at least one mounting pin disposed on each of said pair of planar side surfaces and a corresponding aperture within each of said two substantially identical channel members for receiving said at least one mounting pin.

5. The modular packaging system for electrical components according to claim 4 further including locking means for selectively retaining said at least one mounting pin within said corresponding aperture.

6. The modular packaging system for electrical components according to claim 5 wherein said locking means comprises a slot within said at least one mounting pin and a movable lock channel within each of said two substantially identical channel members for selectively engaging said slot.

7. The modular packaging system for electrical components according to claim 6 wherein said slot within said at least one mounting pin includes a bevel surface and wherein engagement of said bevel surface by said movable lock channel serves to urge each of two said substantially identical exterior panel members against said two substantially identical channel members.

8. The modular packaging system for electrical components according to claim 1 further including a base member for underlying said at least one generally rectangular card cage.

9. The modular packaging system for electrical components according to claim 8 further including means for coupling said base member to both of said two substantially identical channel members.

10. The modular packaging system for electrical components according to claim 1 wherein each of said two substantially identical exterior panel members is constructed of foamed plastic.

11. The modular packaging system for electrical components according to claim 3 wherein said top panel is constructed of foamed plastic.

12. The modular packaging system for electrical components according to claim 1 wherein each of said two substantially identical channel members is formed integrally with said at least one generally rectangular card cage.

* * * * *